United States Patent [19]

Goldman et al.

[11] Patent Number: 5,339,407
[45] Date of Patent: Aug. 16, 1994

[54] RECOVERY OF CACHED DATA FROM A MALFUNCTIONING CPU

[75] Inventors: Gary S. Goldman; Silas P. Elash, both of San Jose; Jeffrey L. Baker, Milpitas, all of Calif.

[73] Assignee: Amdahl Corporation, Sunnyvale, Calif.

[21] Appl. No.: 954,506

[22] Filed: Sep. 29, 1992

[51] Int. Cl.[5] .............................................. G06F 12/00
[52] U.S. Cl. ................... 395/575; 395/425; 371/14; 364/964.27
[58] Field of Search ...................... 395/575, 425, 200; 371/8.1, 14; 364/260.2, 964.27, 964.7

[56] References Cited

U.S. PATENT DOCUMENTS

5,265,235 11/1993 Sindhu et al. .................. 395/425

Primary Examiner—Vincent P. Canney
Attorney, Agent, or Firm—Fliesler, Dubb, Meyer & Lovejoy

[57] ABSTRACT

Recovery of data from a store-to cache in a malfunctioning CPU, is accomplished without exercising the hardware of the malfunctioning CPU. A data path which is independent of the normal operating paths of the computer, such as a scan facility, is used to move data out of the cache into the mainstore while the malfunctioning CPU's clocks are off. A system controller controls normal transfer of data between the cache memory of the processing unit and the mainstore. A service processor is coupled to the processing unit, the mainstore, and the system controller, and is responsive to the detection of errors in the processing unit, for stopping the processing unit and moving data out of the cache memory to the mainstore through the scan facility separate from the system controller. Logic in the system controller flushes the move out queue or other storage locations in the system controller. After the data in the system controller has been flushed, the service processor moves the data from the cache memory into the mainstore. This prevents data moved out of the cache in the mainstore from being overwritten by move outs which were pending in the system controller at the time that the CPU was stopped.

25 Claims, 6 Drawing Sheets

RECOVERY OF CACHED DATA FROM A MALFUNCTIONING CPU

BACKGROUND OF THE INVENTION

1. Field of the Invention

The present invention relates to recovery of cached data from a malfunctioning CPU; and, more particularly, to a technique for disabling a malfunctioning CPU while recovering the data stored in the cache of the CPU in a large scale, multiprocessor computer system.

2. Description of Related Art

Large scale data processing systems, such as those operating in accordance with the IBM ESA/390 architecture, include a plurality of central processing units. Each central processing unit includes a cache which stores data which may have been modified by the CPU. When a particular CPU malfunctions, the CPU must be stopped; data must be recovered from the cache, and then the system must be reconfigured to disable the CPU until it can be repaired or replaced.

In one type of computer system, the cache memory associated with the CPU is referred to as a "store-to" cache. A store-to cache may store lines of data that have been modified by the local CPU, but have not yet been copied back to mainstore. Thus, the cache may hold the only valid, current copy of a line of data. In order to disable a CPU which includes a store-to cache, it is critical to data integrity of the overall system to be able to recover the modified lines of data from the malfunctioning CPU.

Prior art techniques involve recovery of the cached data using the hardware of the CPU which is malfunctioning. This creates the risks that the malfunctioning CPU hardware will cause errors in the data that cannot be corrected or may not be able to recover the data at all.

Therefore, it is desirable to accomplish the disabling of a malfunctioning CPU, while recovering modified lines of data from the CPU, without reliance on the malfunctioning CPU hardware to deliver the modified data.

SUMMARY OF THE INVENTION

The present invention provides an apparatus which allows recovery of data from a store-to cache in a malfunctioning CPU, without exercising the hardware of the malfunctioning CPU. The invention involves using a data path which is independent of the normal operating paths of the computer, such as a scan facility, to move data out of the cache into the mainstore while the malfunctioning CPU's clocks are off. Thus, data can be recovered and stored back to mainstore via a scan facility, or other independent data path, without running the damaged CPU's clocks. Once the data recovery is complete, the CPU may be logically removed from the system until repaired. There is no loss of data integrity, and other CPUs remain available throughout the procedure.

Accordingly, the invention can be characterized as a computer system which comprises a processing unit including a cache memory, and error detection logic for the processing unit. A mainstore is coupled to the processing unit, and to other processing units in the system. A system controller controls transfer data between the cache memory of the processing unit and the mainstore. A service processor is coupled to the processing unit, the mainstore, and the system controller, and is responsive to the detection of errors in the processing unit, for stopping the processing unit and moving data out of the cache memory to the mainstore across a path separate from the system controller.

The cache memory in the preferred system comprises a store-to cache in which valid, modified lines of data may be stored without current copies in mainstore. A cache tag is included, which stores an indication of whether or not corresponding lines in the store-to cache have been modified. The service processor reviews data from the cache tag to identify the modified lines of data and only moves modified lines to the mainstore.

The system controller includes one or more storage locations, such as data buffers and a move out queue which holds data subject of pending transfers to mainstore from processing units in the system. Logic in the system controller is responsive to commands from the service processor to flush the operations affecting the move out queue and other storage locations in the system controller. After the data in the system controller has been flushed, the service processor moves the data from the cache memory into the mainstore through the scan facility. This prevents data moved out of the cache in the mainstore from being overwritten by move outs or other operations which were pending in the system controller at the time that the CPU was stopped.

The flush logic may execute the flush using the normal data paths of the system controller to the mainstore, or may use independent paths such as the scan facility through the service processor, as suits the needs of a particular design.

The system controller includes a request interface which receives requests for service from the CPUs. Also, each CPU includes an interface to the system controller. The flush logic disables the request interface during the flush, so that no additional requests for service are accepted until the flush is complete and the malfunctioning CPU is disabled. Also, the interface of the malfunctioning CPU is set to an idle or safe value when the processing unit is stopped. This prevents bad data on the interface of the malfunctioning processing unit from being misinterpreted as a valid request for access to the system controller, while the processor is disabled.

Other aspects and advantages of the present invention can be seen upon review of the figures, the detailed description, and the claims which follow.

DESCRIPTION OF THE PREFERRED EMBODIMENTS

Figure 1:
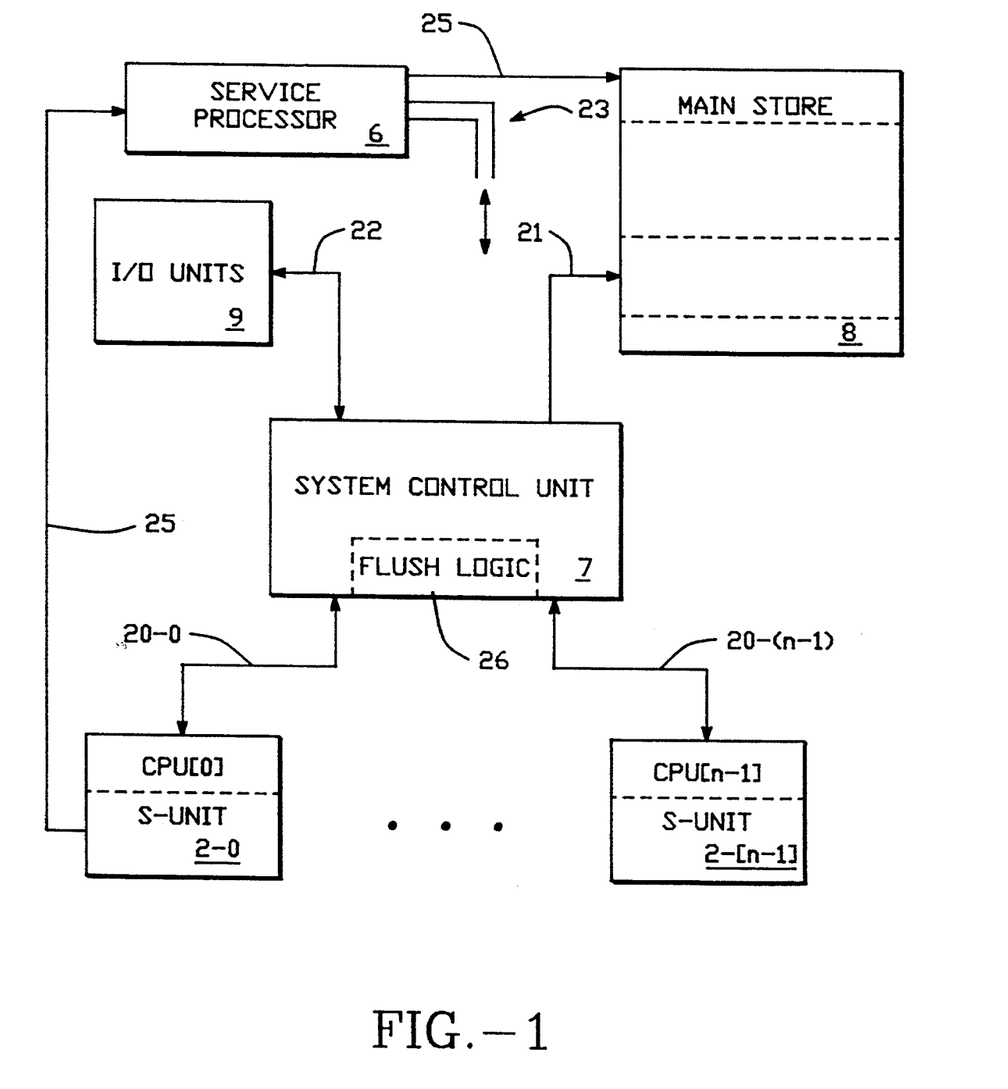
FIG. 1 depicts a block diagram of a multiple CPU computer system incorporating the present invention.
Figure 2:
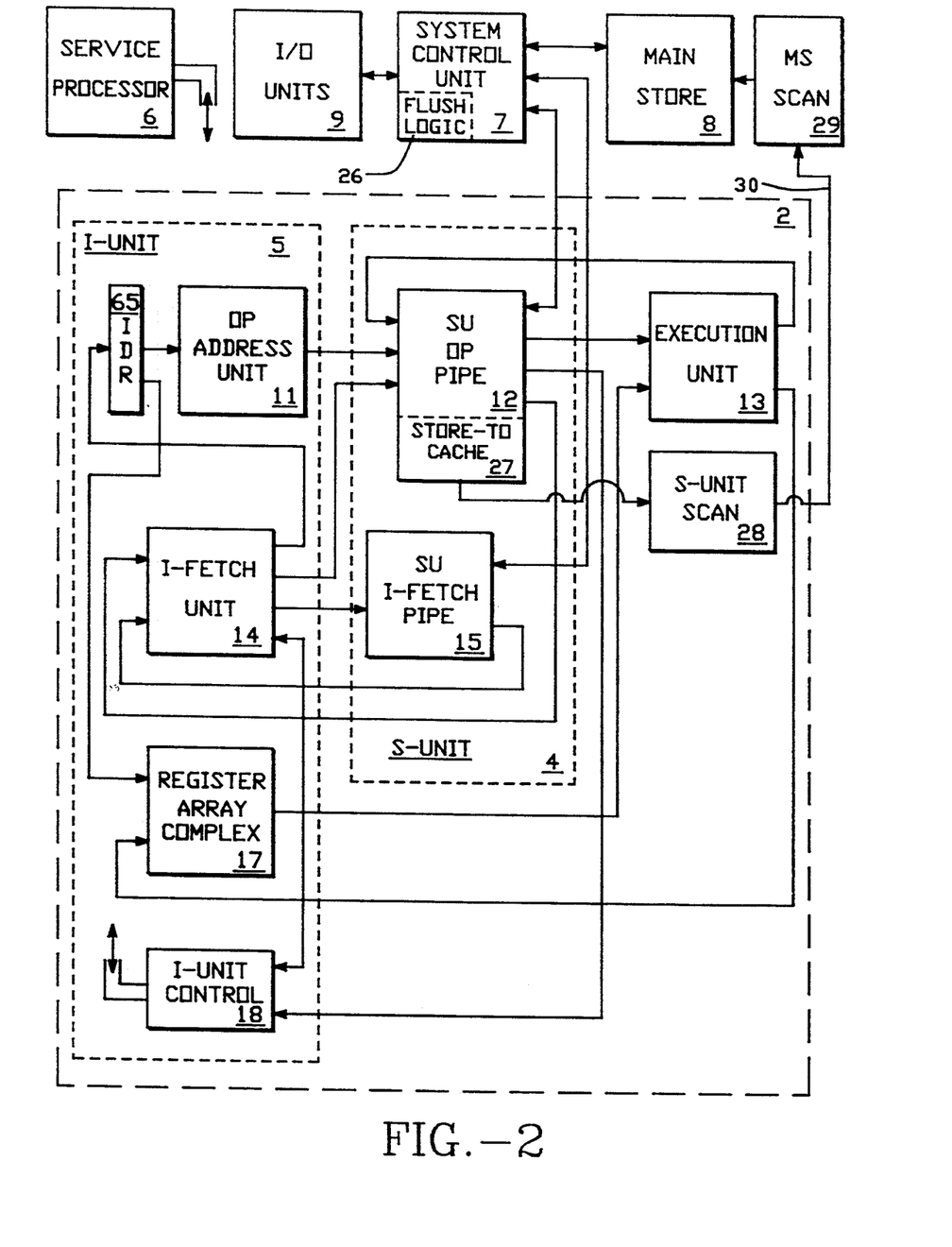
FIG. 2 depicts a block diagram of a CPU incorporating the present invention.
Figure 3:
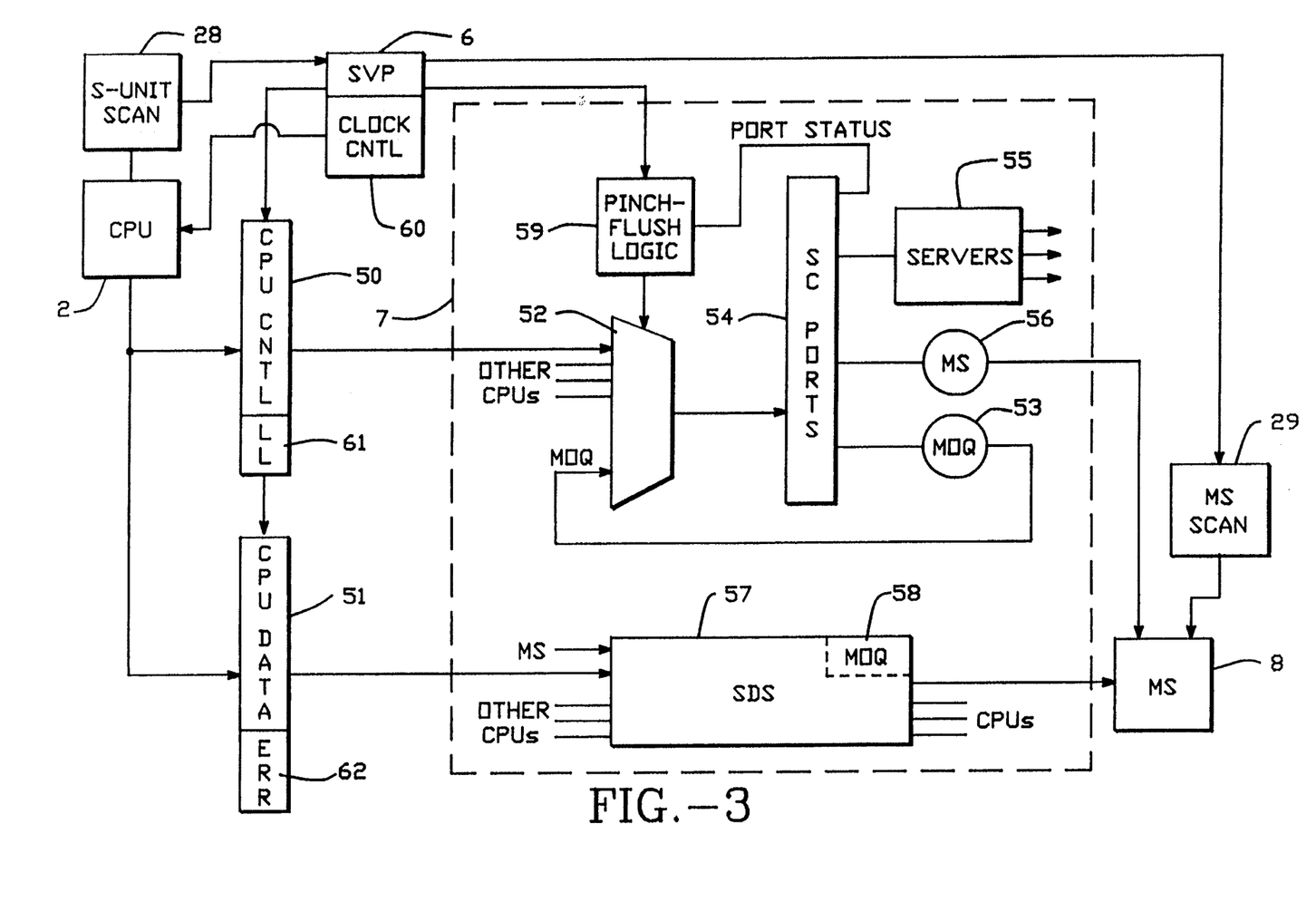
FIG. 3 is a functional block diagram showing components of a preferred embodiment of a computer system according to the present invention.
Figure 4:
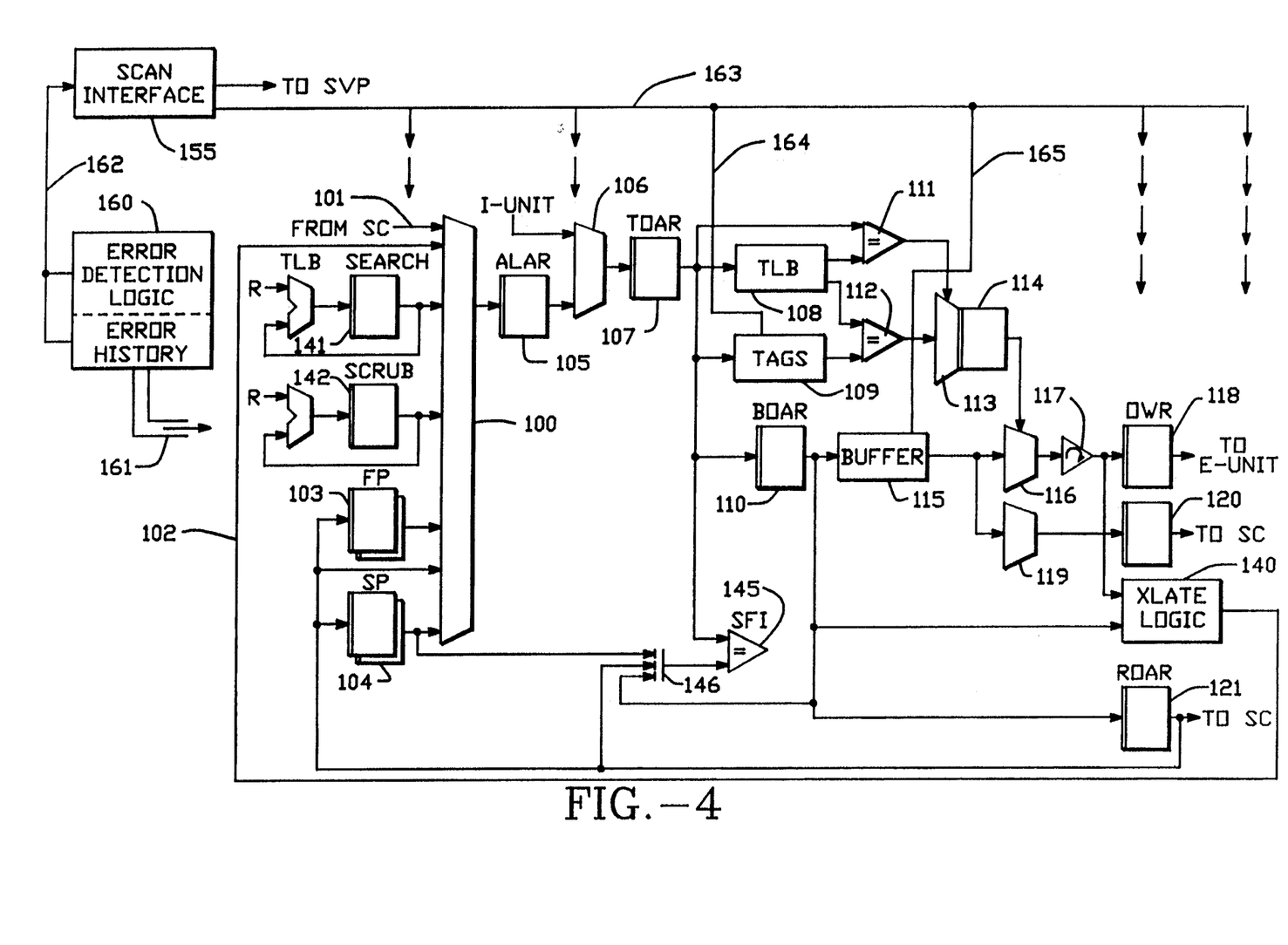
FIG. 4 is a schematic block diagram of the storage unit pipeline according to the present invention.
Figure 5:
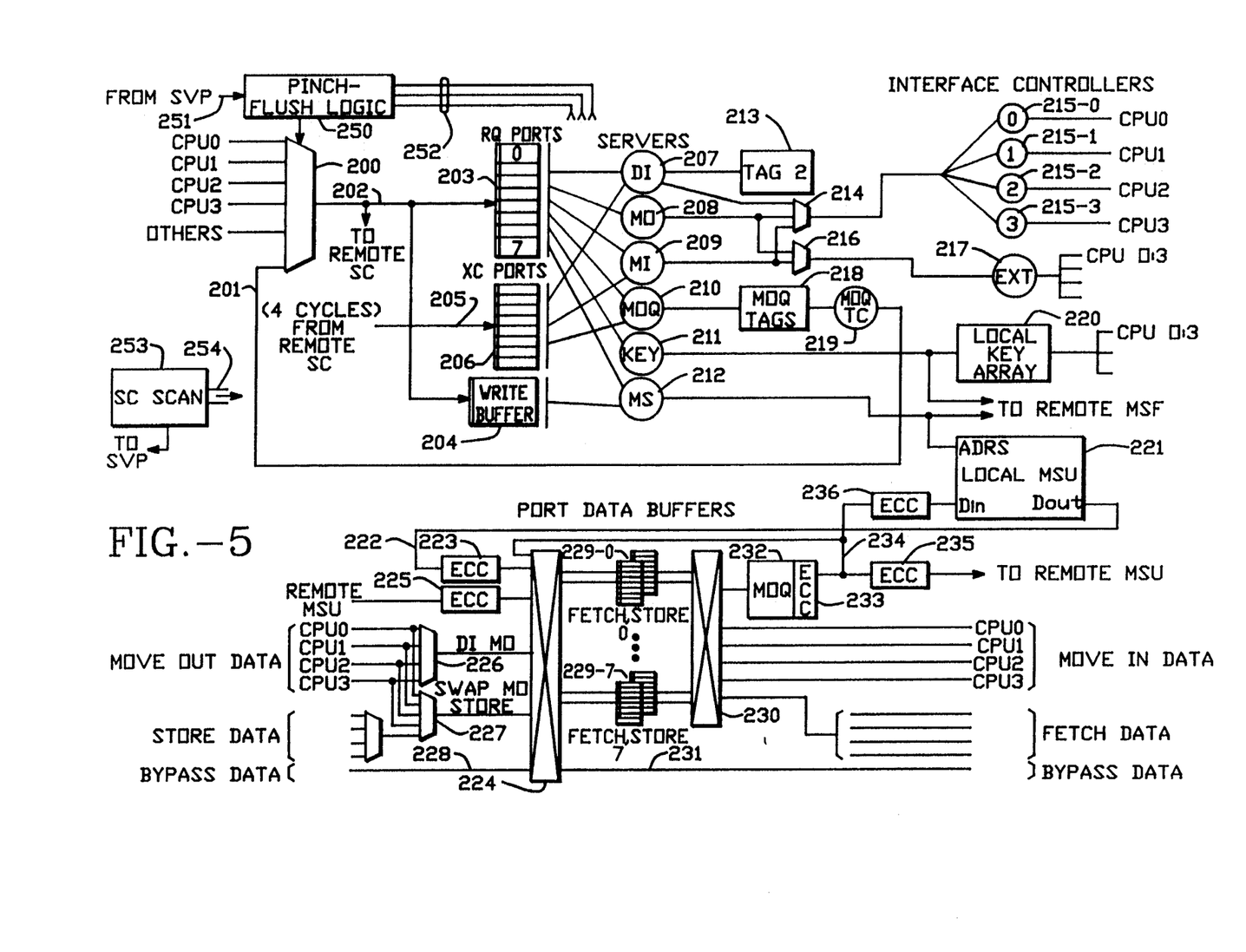
FIG. 5 is a functional block diagram of the system controller for a multi-CPU system according to the present invention.
Figure 6:
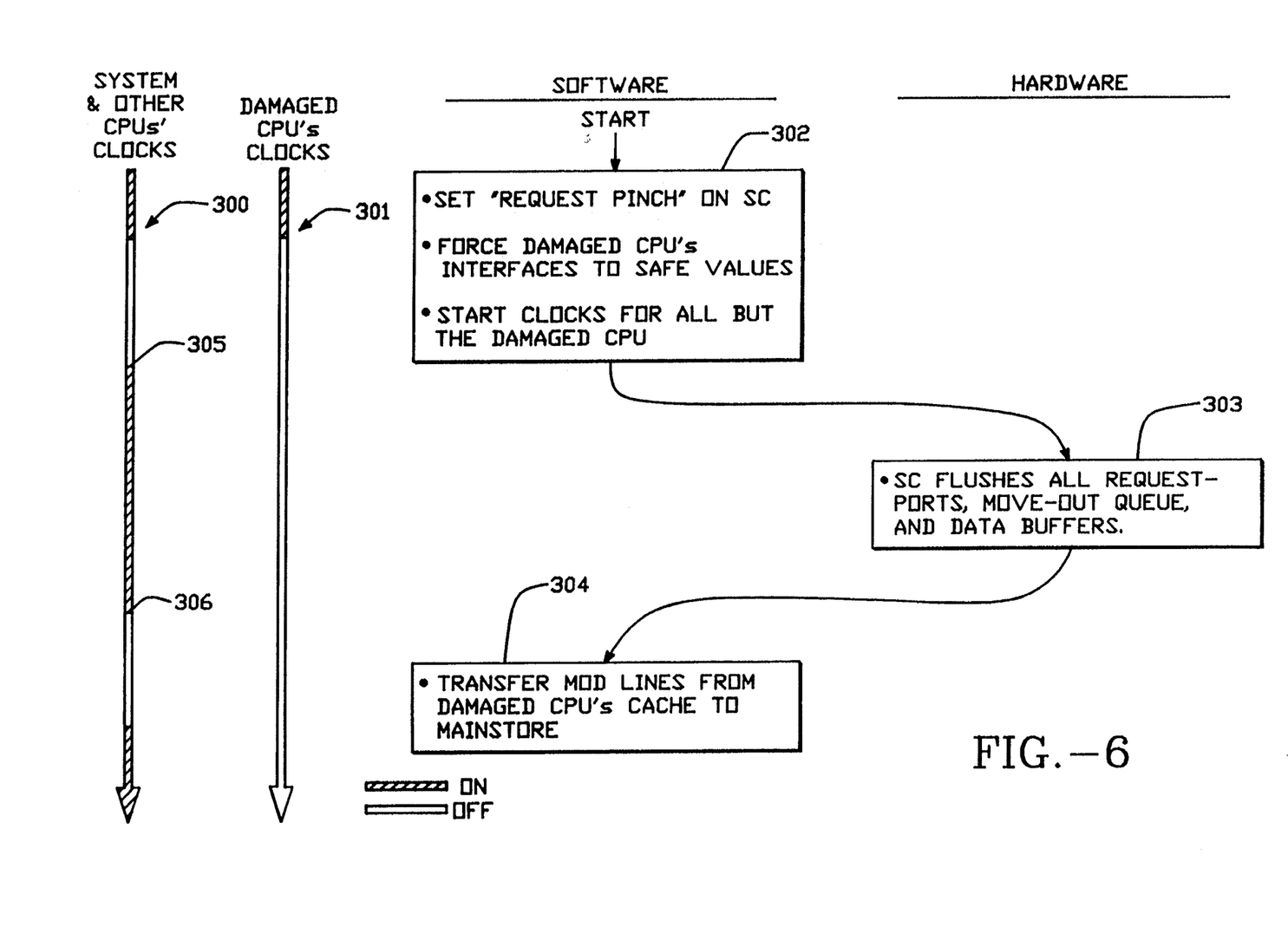
FIG. 6 is a diagram of the algorithm used in a preferred embodiment of the present invention.

A detailed description of a preferred embodiment of the present invention is provided with respect to the figures. FIGS. 1 and 2 provide a computer system overview. FIG. 3 illustrates a preferred embodiment of the present invention. FIGS. 4 and 5 set out a more detailed description of the storage unit operand pipeline, including a store-to cache, and the system controller according to the present invention. FIG. 6 illustrates the algorithm flow for the recovery of cache data according to the present invention.

FIG. 1 illustrates a multi-CPU computer system according to the present invention. The computer system includes a plurality of central processing units, each having a storage unit with a store-to cache according to the present invention. Thus, CPUs (0) through CPU (n−1) are given reference numbers 2-0 through 2-(n−1). Each of the CPUs is coupled to a system control unit 7 across interfaces 20-0 through 20-(n−1). The system control unit also includes a mainstore interface 21. The system control unit 7 controls access to data among the CPUs and mainstore 8. Also coupled to the system control unit 7 through interface 22 are the input-/output units 9. A service processor 6 is coupled to all of the functional units of the computer system, as indicated by arrows 23 through a scan interface or otherwise as known in the art. The scan interface provides access to storage locations in the CPUs, and system control units through a path independent of the normal operational path of the CPUs and system control unit. Thus, the service processor 6 is able to scan cache data and data indicating the state of the computer system out of the computer system without using the normal control path. Also, the service processor is able to write data into specific service data locations within the functional units of the system.

As indicated in the figure, each of the CPUs, CPU-0 through CPU-n−1 includes an individual storage unit (S UNIT). Each storage unit includes an operand store-to cache and an instruction cache. The figure also includes a specific path 25 from the S UNIT of a specific CPU 2-0 to the service processor 6, such as a scan facility, and from the service processor 6 to mainstore 8. This path 25 allows transfer of data from a malfunctioning CPU to mainstore separate from the system controller 7. The system controller 7 also includes flush logic 26 as described in more detail below.

FIG. 2 provides a more detailed diagram of a CPU 2 according to the present invention. The CPU 2, as illustrated in FIG. 1, is coupled to the system control unit 7 having flush logic 26, which is in turn coupled to the mainstore 8 and the I/O units 9. Service processor 6 is coupled to the CPU 2 with scan-in and scan-out facilities.

The CPU 2 includes an instruction unit 5 (I UNIT), a storage unit 4 (S UNIT), and an execution unit 13 (E UNIT). The I UNIT 5 includes an instruction decode register 65 (IDR) which supplies input to an operand address unit 11. Also, the IDR 65 supplies input to register array complex 17. The input to the IDR 65 is provided by an instruction fetch unit 14 (I FETCH UNIT). I UNIT control 18 controls the operation of the functional blocks of the I UNIT 5 and includes explicit connections to the I FETCH UNIT 14 and the S UNIT operand pipe 12.

The S UNIT 4 includes a storage unit operand pipe 12 including a store-to cache 27 and a storage unit I FETCH pipe 15. Coupled to the I FETCH pipe 15 is an associatively addressed instruction cache. The S UNIT operand pipe 12 is addressed from the output of the operand address unit 11 and the I FETCH UNIT 14. The S UNIT I FETCH pipe 15 receives its addresses from the I FETCH UNIT 14.

The S UNIT operand pipe 12 supplies data to the E UNIT 13, the I UNIT control 18, and the I FETCH UNIT 14. The S UNIT I FETCH pipe 15 provides data to the I FETCH UNIT 14. Both the S UNIT I FETCH pipe 15 and the S UNIT operand pipe 12 are coupled to the system control unit 7, through which access to the mainstore 8 is provided and data integrity operations are accomplished to insure cache consistency with other CPUs in the system.

The E UNIT 13 provides resulting data to the S UNIT operand pipe 12 and to the register array complex 17.

Also shown in FIG. 2 are an S UNIT scan facility 28 and a mainstore scan facility 29. The S UNIT scan facility 28 is coupled to the store-to cache 27, and across line 30 to the mainstore scan facility 29. The mainstore scan facility 29 is coupled to the mainstore 8. The service processor 6 controls the S UNIT scan facility 28 and the mainstore scan facility 29. The line 30 is a schematic representation of the data path from the S UNIT scan facility 28 to the mainstore scan facility 29, which is operated under control of the service processor 6. This facility provides the ability to take modified lines out of the store-to cache when the clocks to the CPU 2 are turned off, and transfer those modified lines to mainstore.

The flush logic 26 in the system control unit 7 is used to ensure the integrity of the transfers from the store-to cache to mainstore, which are accomplished through the service processor 6. More information concerning the operation of a flush logic is provided with respect to FIG. 3.

The overall computer system as described in FIGS. 1 and 2 operates in accordance with the IBM ESA/390 architecture and is further compatible with the Amdahl 5995-M computer.

FIG. 3 provides a schematic representation of the computer system implementing the present invention. The system includes a CPU 2, having an S UNIT scan facility 28. The S UNIT scan facility 28 is coupled to a service processor 6. The service processor is also coupled to the mainstore scan facility 29. The mainstore scan facility 29 is coupled to mainstore 8. The CPU 2 includes a control interface 50 and a data interface 51 to the system controller, generally 7. The system controller includes a request interface 52 which receives requests from the CPU 2, other CPUs, and a move out queue server 53 within the system controller. The request interface 52 controls the transfer of requests from the interface to system controller ports 54. System controller ports 54 include requests for system controller services provided by a plurality of servers 55. Specific servers involved include a mainstore server 56 coupled to mainstore 8, and the move out queue server 53 as mentioned above.

The system controller also includes a system data switch 57 which receives data from the CPU data interface 51, from other CPUs, from the mainstore, and from elsewhere in the system, and supplies data to the mainstore, to the other CPUs, and elsewhere in the system.

The system data switch 57 includes a move out queue 58 which stores lines of data which are subject to pending move out requests to the mainstore 8, as well as other data buffers holding data subject of other system controller services.

The system controller includes pinch-flush logic 59. The pinch-flush logic 59 is coupled to the system controller ports 54 to receive port status information, and to the service processor 6 to receive pinch and flush commands.

The system also includes a clock controller 60 which is coupled to the service processor 6. When the service processor 6 detects that a CPU 2 must be disabled, the clock controller is signalled to turn off the clocks to the CPU. Also, when the CPU is to be disabled, the service processor signals the CPU control interface 50 and the CPU data interface 51 to set the interfaces at safe values so that the disabled CPU interface is not mistakenly interpreted as including valid requests for system controller services.

In order to prevent exercise of possible broken CPU hardware, recovery of cache data is done with clocks off, by a service processor 6 scan algorithm.

Before data can be recovered in this manner, the system controller must guarantee that no data integrity protection mechanisms will be violated by the direct CPU to mainstore copy. As described below, only modified, and therefore private, lines are scan transferred, so no data integrity searches need to be done to check data coherency with other caches. However, boundary conditions in which a request for one of these lines has already been accepted, but not yet completed from a different CPU must be handled.

Thus, the flush logic 59 is included in the system controller. In response to a command from the service processor 6, the flush logic fully flushes the system controller of all requests in its ports, and of all lines of data in the move out queue 58 and other data buffers. The flush finishes processing of current requests, frees up any resources that those requests were holding, and clears the system controller data buffers. This requires the system controller to "pinch", or deny acceptance for any new external requests through interface 52, and to run with the clocks on until the flush is complete. Note that the pinch does not deny requests generated internal to the system controller, such as requests to backstore data from the move out queue.

Although the flush period requires system clocks to be running, the disabled CPU's clocks are left off, and its interfaces are forced to safe values. This allows the system controller to operate as if the CPU were still running during the flushing period without exposing the system to additional errors generated from that CPU. Once the flush is completed, the cache data is scan transferred to mainstore, and the CPU may be safely deconfigured from the system.

In a preferred system, the safe values at the CPU interfaces 50 and 51 include a "line locked" (LL) signal 61, and a "move out data in error" (ERR) signal 62. The "line locked" signal 61 indicates that a line being moved out of the S UNIT is "locked" in the S UNIT. This forces the system controller to drop the move out operation which, in turn, causes the requestor to retry. This signal is only examined at the beginning of a move out operation, so forcing it to a true value works only for move outs that have not yet begun before the service processor decides to take the CPU offline.

The "move out data in error" signal is relied upon for move outs which have begun before a service processor decides to take the CPU offline, but is yet to complete. This signal indicates that one segment of the data is damaged. In the preferred system, cache lines are 128 bytes long, but the CPU interface to the system controller is only 16 bytes long. Thus, eight 16 bytes transfers must be executed to complete a move out to the system controller. The "move out data in error" signal indicates that one 16 byte segment of the data is erroneous. This signal is examined as each segment is taken from the processing unit to the system data switch 57 during a move out sequence. The system controller passes the ERR signal to the requestor of the data, which causes the requestor to retry after the flush is completed. Reliance on the "move out data in error" signal 62 is necessary arises only in an unlikely boundary condition.

FIG. 4 is a simplified functional diagram of the S UNIT operand pipe. The system includes priority logic 100 receiving a plurality of requests for access to the cache. The inputs to the priority logic 100 include requests from the system controller (SC) 101, and requests 102 for processes from address translation logic 140. Also, requests from fetch ports 103, store ports 104, TLB search logic 141, and background cache error scrubbing logic 142 are connected to priority logic 100. The output of the priority logic 100 is supplied to an address register 105. The address register 105 supplies its output to a second level of priority logic 106. The instruction unit has an access to the storage unit pipe through priority logic 106. The output of the priority logic 106 is supplied to the T cycle operand address register 107. The T cycle operand address register 107 is used to access the translation lookaside buffer 108 (TLB) and tag memory 109 and is connected to store-fetch interlock (SFI) comparator 145. Also, the output of the T cycle operand address register 107 is supplied to the B cycle operand address register 110.

The output of the TLB 108 is supplied to TLB match logic 111 in parallel with the output of the T cycle operand address register 107. Similarly, the output of the tag memory 109 is supplied to tag match logic 112 in parallel with a segment of the TLB memory 108. The output of the tag match logic is supplied to associativity selector 113 which is further enabled by the TLB match logic 111. The results of the tag match are stored in register 114.

In parallel, the B cycle operand address register 110 is used to access the buffer memory 115. The outputs of the buffer memory 115 are supplied to associativity selector 116 which is enabled by the results of the tag match from register 114. The output of the selector 116 is supplied through alignment logic 117 to operand word register 118, and then to the execution unit. Also, the output of alignment logic 117 is supplied to the translation logic 140, which supports address translations used for logical and real addressing.

Similarly, the output of the buffer 115 is supplied to associativity select logic 119 and on to a data move out register 120 which is coupled to the system controller.

The output of the B cycle operand address register supplied to the translation logic 140, and to an R cycle operand address register 121 which is connected to the system controller, and to the store ports 104 and fetch ports 103. The outputs of the B cycle operand address register 110, R cycle operand address register 121, and store ports 104 are coupled in a logical OR function 146 to the SFI comparator 145.

In the system described in FIG. 4, the TLB 108, tags 109, and buffer 115 are divided into a plurality of segments or associativities. Thus, the TLB match logic 111 and tag match logic 112 includes a match logic segment for each associativity of the TLB and the tag.

Not shown in FIG. 4 are control paths for op codes, status valid signals, domain state signals, parity checking logic, and other information involved in the pipeline.

Also shown in FIG. 4 are error detection logic 160, with error history mechanisms and the like. Error detection logic 160 is coupled to the operand pipe through lines 161 at all error checked locations in the pipe. The error detection logic and the error history mechanism are coupled to a scan interface 155 across line 162. The scan interface is also coupled across line 163 to storage locations distributed throughout the pipeline. Specifically, connections are made on lines 164 and 165 to the tags 109 and the buffer 115. In the transfer of data from the buffer 115 to the mainstore, the tags 109 are reviewed by the service processor through the scan interface 165 to identify modified lines. Only modified lines are scanned into the mainstore. Alternatively, service processor may identify only private, and therefore modifiable, lines. In such a system which does not mark modified lines, but marks modifiable lines in the tag, will be sufficient to scan all private or modifiable lines to mainstore, whether or not they had been previously modified.

The interface to the system controller through register 120 and register 121 provide the data and address signals necessary to support a request for system controller services. There are also other control signals involved in the interface, such as those described above with respect to FIG. 3.

FIG. 5 illustrates a functional block diagram of the system controller according to the present invention. The system controller includes a system for controlling access to data among the CPUs and other portions of the system, such as the service processor, the main storage unit, I/O processors, and the like. Thus, it includes an input priority logic 200 which receives requests from CPU O through CPU n (n=3 in the embodiment of FIG. 5). Other requestors to the system controller are also supplied as inputs to the priority logic 200, such as the service processor, I/O processors, and the like. Also, a move out queue bus 201 is supplied as an input to the priority logic 200. The output of the priority 200 is supplied on line 202 to the request ports 203 and to a write buffer 204. A remote system controller (in a system including a plurality of system controllers) is also coupled through line 205 to cross coupled request ports 206.

The request ports 203 and 206 are coupled to a plurality of servers, including a data integrity server 207, a move out server 208, a move in server 209, a move out queue server 210, a key server 211, and a mainstore server 212. The remote system controller has access only to the data integrity server 207, move in server 209, and move out queue server 210. The write buffer 204 has access only to the mainstore server 212 and is dedicated for writes to mainstore.

The data integrity server 207 is coupled to the TAG2 logic 213. The TAG2 logic includes copies of the tags from all of the storage units for the CPUs of the system. Thus, data integrity and cache consistency operations are carried out using the data integrity server 207 and the TAG2 logic 213. Requests for data from the data integrity server 207, move out server 208, and move in server 209, are supplied through selector 214 to the interface controllers for each of the CPUs 215-0 through 215-3. Also, requests from move out server 208 and move in server 209 are supplied through selector 216 through cross-coupled interface controller 217 to the CPUs and other requestors in the system, such as service processors, I/O processors, and the like.

The move out queue server 210 is coupled to the move queue tags 218 and the move out queue controller 219. The output of the move out queue controller 219 is supplied on line 201 to the select logic 200.

The key server 211 drives local key array 220 and is coupled to a remote mainstore facility. The local key array 220 is used to provide storage keys to the CPUs and other requestors in the system.

The mainstore server 212 supplies addresses to the local mainstore unit 221, and to a remote mainstore facility if present in the system.

The data paths for the system controller are shown in the bottom half of the figure. The output of the local mainstore unit is supplied on line 222 to ECC logic 223. The output of the ECC logic 223 is supplied to a switch 224. Other inputs to the switch 224 include the output of ECC logic 225 which is supplied from the remote mainstore unit, the output of the selector 226 which is used to supply data integrity move out data from the CPUs, and output of the selector 227 which is used to supply swap move out data from the CPUs in the system and store data from the various units in the system. Finally, the switch 224 receives bypass data across line 228. The output of the switch 224 supplied to the fetch and store buffers 229-0 through 229-7. The data in the fetch and store buffers is supplied through switch 230. The switch 224 also supplies bypass path 231.

The output of the switch 230 supplies move out queue buffers 232 with associated ECC logic 233, the move in data paths to the respective CPUs, and the fetch data paths to the variety of fetch data requestors. The output of the move out queue ECC logic 233 is supplied on line 234 through error checking correcting logic 235 to the remote mainstore unit, and through ECC logic 236 to the local mainstore unit. Also, the data on line 234 is supplied as an input to the switch 224.

FIG. 5 also illustrates the pinch-flush logic 250 which is coupled to the system controller ports across lines 252, and receives commands from the service processor across line 251. The pinch-flush logic 250 controls the interface 200 to flush the system controller in the event of a malfunctioning CPU as described above with respect to FIG. 3.

Also shown in FIG. 5 is a system controller scan facility 253, which is coupled to storage locations throughout the system controller across lines 254 and to the TAG2 buffer 213. Thus, in an alternative system, rather than completing the flush of the system controller through normal data paths by executing all pending requests for service, the scan facility 253 can be exercised through the service processor to control the integrity of the direct store-to cache to mainstore transfer.

Also, after the transfer to mainstore is completed, the TAG2 buffer is updated by the service processor using the scan facility.

FIG. 6 illustrates the algorithm flow for recovery of cache data using the direct cache to mainstore transfer. As can be seen in FIG. 6, a first timeline 300 illustrates the on and off state of the system controller and other CPU clocks. A second timeline 301 illustrates the on and off state of the damaged CPU's clocks. In a first segment, the clocks in both timelines are on. Upon detection of an error, the clocks are turned off, the service processor software evaluates the error and decides to disable the damaged CPU. Upon this decision, the direct transfer starts with block 302. As shown in block 302, the algorithm first sets request pinch on the system controller to prevent acceptance of additional requests. The damaged CPU's interfaces are set to safe values, and then the clocks are started for all but the damaged CPU. Thus, as can be seen on timeline 300, clocks are turned on at point 305 for the system controller and the undamaged CPUs.

In the next step of the algorithm, illustrated at block 303, the system controller flushes all request ports, the move out queue, and other data buffers. This operation occurs with the system controller and other CPU clocks on, but the damaged CPU clocks off.

In the final step, the software transfers modified lines from the cache in the damaged CPU to mainstore, as illustrated in block 304. This step is also accomplished with all clocks off as indicated at point 306, which provides access to the mainstore by the scan facility without interference. When the modified lines have been transferred into the mainstore and TAG2 buffers updated, then the system controller and other CPU clocks are turned back on, and the damaged CPU's clocks are left off. At this point, the damaged CPU can be logically deconfigured from the system, and repaired.

Thus, the present invention can be described as a method or apparatus for recovering data from a store-to cache in a malfunctioning CPU. According to this scheme, data can be recovered and stored back to mainstore via a scan facility, or other path separate from the normal operating path of the computer, without running the clocks of the damaged CPU. Once the data recovery is complete, the CPU may be logically removed from the system until repaired. There is no loss of data integrity, and other CPUs are made available throughout the procedure. Therefore, overall system performance is improved.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A computer system, comprising:
   a processing unit including a cache memory and means for detecting errors in the processing unit;
   a mainstore;
   means, coupled to the processing unit and the mainstore, for controlling transfer of data between the cache memory and the mainstore; and
   a service processor, coupled to the processing unit, the mainstore and the means for controlling transfer of data, and responsive to the detection of errors in the processing unit, for stopping the processing unit and moving data out of the cache memory to the mainstore across a path separate from the means for controlling.

2. The computer system of claim 1, wherein the service processor includes a scan facility which provides the path for scanning data out of the cache memory and into the mainstore separate from normal data paths of the computer system.

3. The computer system of claim 1, wherein the service processor includes means for identifying lines of data in the cache memory which may have been modified, and is responsive to the means for identifying to only move identified lines to the mainstore.

4. The computer system of claim 1, wherein the cache memory comprises a store-to cache in which valid modified lines of data may be stored without current copies in mainstore.

5. The computer system of claim 1, wherein the cache memory comprises:
   a store-to cache in which valid modified lines of data may be stored without current copies in mainstore; and
   a cache tag, including means for indicating whether corresponding lines in the store-to cache are held in a private, modifiable state or a public, non-modifiable state by the processing unit.

6. The computer system of claim 5, wherein the service processor includes means for reviewing the cache tag to identify private lines of data, and only moves private lines to the mainstore.

7. The computer system of claim 1, wherein the means for controlling transfer of data includes at least one storage location for storing data subject of a transfer to the mainstore, and logic responsive to commands from the service processor to flush the at least one storage location; and wherein the service processor moves the data from the cache memory to mainstore after the flush.

8. A computer system, comprising:
   a processing unit including a cache memory and means for detecting errors in the processing unit;
   a mainstore;
   means, coupled to the processing unit and the mainstore, for controlling transfer of data between the cache memory and the mainstore, including at least one storage location for storing data subject of a transfer to the mainstore, and logic responsive to flush commands to flush the at least one storage location;
   a scan facility, coupled to the cache memory and the mainstore, which provides the path for scanning data out of the cache memory and into the mainstore separate from normal data paths of the computer system; and
   a service processor, coupled to the processing unit, the scan facility, the mainstore and the means for controlling transfer of data, and responsive to the detection of errors in the processing unit, for stopping the processing unit, issuing a flush command and moving data out of the cache memory to the mainstore through the scan facility after the at least one storage location is flushed.

9. The computer system of claim 8, wherein the cache memory comprises:
   a store-to cache in which valid modified lines of data may be stored without current copies in mainstore; and
   a cache tag, including means for indicating whether corresponding lines in the store-to cache are held in a private, modifiable state or a public, non-modifiable state by the processing unit.

10. The computer system of claim 9, wherein the service processor includes means for reviewing data scanned out from the cache tag to identify private lines of data, and only moves private lines to the mainstore.

11. The computer system of claim 8, wherein the cache memory comprises:
- a store-to cache in which valid modified lines of data may be stored without current copies in mainstore; and
- a cache tag, including means for indicating whether corresponding lines in the store-to cache are held in a modified state or a non-modified state by the processing unit.

12. The computer system of claim 11, wherein the service processor includes means for reviewing data scanned out from the cache tag to identify modified lines of data, and only moves modified lines to the mainstore.

13. The computer system of claim 8, wherein the means for controlling transfers includes a queue for transfers to the mainstore, and the flush logic flushes the queue by moving data in the queue to the mainstore through normal circuit paths.

14. The computer system of claim 8, wherein the means for controlling transfers includes a queue, coupled to the scan facility, for transfers through normal circuit paths to the mainstore, and the flush logic flushes the queue by moving data in the queue to the mainstore through the scan facility.

15. The computer system of claim 8, wherein the means for controlling transfers includes a request interface receiving requests for service, and the flush logic includes means for disabling the request interface from accepting new requests during the flush.

16. The computer system of claim 8, wherein the processing unit includes an interface to the means for controlling transfers, and means responsive to the service processor for setting the interface to a safe value when the processing unit is stopped.

17. A computer system, comprising:
- a mainstore;
- a plurality of processing units including respective store-to caches in which valid modified lines of data may be stored without current copies in mainstore, and means for detecting errors in the plurality of processing units;
- means, coupled to the plurality of processing units and the mainstore, for controlling transfer of data between the respective store-to caches and the mainstore, including a queue for storing data subject of pending transfers to the mainstore, and logic responsive to flush commands to flush the queue;
- a scan facility, coupled to the respective store-to caches and the mainstore, which provides the path for scanning data out of the respective store-to caches and into the mainstore separate from normal data paths of the computer system; and
- a service processor, coupled to the plurality of processing units, the scan facility, the mainstore and the means for controlling transfer of data, and responsive to the detection of errors in a particular processing unit in the plurality of processing units, for disabling the particular processing unit, issuing a flush command and moving data out of the cache memory to the mainstore through the scan facility after the queue is flushed.

18. The computer system of claim 17, wherein the means for controlling transfers includes a request interface receiving requests for service from the plurality of processing units, and the flush logic includes means for disabling the request interface from accepting new requests during the flush.

19. The computer system of claim 17, wherein the plurality of processing units include respective interfaces to the means for controlling transfers, and means responsive to the service processor for setting the interface of the particular processing unit to a safe value when the particular processing unit is disabled.

20. The computer system of claim 19, wherein the interface of the particular processor includes a line locked signal indicating a line subject of a move out request is held in a locked state, and the safe value of the interface includes a true line locked signal to cause means for controlling transfers to drop attempted move outs from the particular processing unit.

21. The computer system of claim 19, wherein the interface of the particular processor includes a move out data error signal indicating a portion of a line subject of a move out request contains erroneous data, and the safe value of the interface includes a true move out data error signal.

22. The computer system of claim 17, wherein the flush logic flushes the queue by moving data in the queue to the mainstore through normal circuit paths.

23. The computer system of claim 17, wherein the queue is coupled to the scan facility, and the flush logic flushes the queue by moving data in the queue to the mainstore through the scan facility.

24. The computer system of claim 17, wherein the processing units include respective cache tags, including means for indicating whether corresponding lines in the respective store-to cache are held in a private, modifiable state or a public, non-modifiable state by the processing unit; and
- wherein the service processor includes means for reviewing data scanned out from the cache tag to identify private lines of data, and only moves private lines to the mainstore.

25. The computer system of claim 17, wherein the processing units include respective cache tags, including means for indicating whether corresponding lines in the respective store-to cache are held in a modified state or a non-modified state by the processing unit; and
- wherein the service processor includes means for reviewing data scanned out from the cache tag to identify modified lines of data, and only moves modified lines to the mainstore.

* * * * *